United States Patent
De Wilde

(10) Patent No.: US 6,825,686 B2
(45) Date of Patent: Nov. 30, 2004

(54) LINE INTERFACE CIRCUIT, ASSOCIATED LINE DRIVERS AND METHODS OF OPERATING THE SAME

(75) Inventor: Wim Andre Paula De Wilde, Heverlee (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 10/335,903

(22) Filed: Jan. 3, 2003

(65) Prior Publication Data

US 2003/0128057 A1 Jul. 10, 2003

(30) Foreign Application Priority Data

Jan. 4, 2002 (EP) .......................................... 02290010

(51) Int. Cl.⁷ ............................................ H03K 17/16
(52) U.S. Cl. ............................. 326/30; 326/82; 326/86; 327/108; 327/109; 327/110; 375/222; 379/399.01
(58) Field of Search .............................. 326/30, 82, 86; 327/108–110; 375/222; 379/399.01; 330/75

(56) References Cited

U.S. PATENT DOCUMENTS

| | | | |
|---|---|---|---|
| 5,856,758 A | | 1/1999 | Joffe et al. |
| 6,097,245 A | * | 8/2000 | Dobbelaere et al. ........ 327/560 |
| 6,218,872 B1 | * | 4/2001 | Koren .......................... 327/108 |
| 6,566,947 B2 | * | 5/2003 | Gorcea .......................... 330/75 |
| 6,665,399 B1 | * | 12/2003 | Gorcea et al. ......... 379/399.01 |
| 2002/0034294 A1 | * | 3/2002 | Servaes et al. ........ 379/399.01 |
| 2002/0090026 A1 | * | 7/2002 | Ashley ...................... 375/219 |

FOREIGN PATENT DOCUMENTS

| | | |
|---|---|---|
| EP | 0 901 221 A1 | 3/1999 |
| EP | 1039702 A1 | 9/2000 |

OTHER PUBLICATIONS

Schweber, Bill, et al.: "Analogue Front Ends Bridge the xDSL to Real World Chasm" EDN, Apr. 1, 1999, pp. 48–64.
E. Nash, "Line–Driver Design for Broadband Communications Applications", Electronic Design Dec. 1, 1997, pp. 81–82,84, 86, 88, 90, 92, and 94.
M. Steffes, "Optimizing Performance in an xDSL Line Driver", Electronic Design, Apr. 19, 1999, pp. 44–49, 52–53, 56–59.

* cited by examiner

Primary Examiner—Michael Tokar
Assistant Examiner—Khai M. Nguyen
(74) Attorney, Agent, or Firm—Sughrue Mion, PLLC

(57) ABSTRACT

A line driver is disclosed comprising a termination portion which includes a termination resistance ($R_{term}$) and which is supplied in use by an operational amplifier (op-amp), with a termination current ($V_{NE}/R$) for load matching. The termination portion further comprises a back-termination transformer (1:α) which is series coupled with the termination resistance ($R_{term}$). The power dissipated in the termination resistance ($R_{term}$) is less than the power (P/2) available to a signal transmission portion for signal transmission along an associated transmission line ($R_{load}$) and the power consumption efficiency of the line driver is improved. (FIG. 4).

29 Claims, 23 Drawing Sheets

G' is the gain of the amplifier of the system and $V_{in}$ is the input voltage.

gain of the system:

$$G = \frac{V_{NE}}{V_{in}} = \frac{G'}{m\left(1 - \frac{\alpha.a}{(2-\alpha)b}\right)} = \frac{G.(2-\alpha)b}{m.(2.b - \alpha.(a+b))}$$

or $$G' = \frac{m.(2.b - \alpha.(a+b))}{(2-\alpha)b}.G$$

LINE INTERFACE CIRCUIT, ASSOCIATED LINE DRIVERS AND METHODS OF OPERATING THE SAME

FIELD OF THE INVENTION

This invention relates to line interface circuits and line drivers and in particular to a line interface circuit or line driver which includes a novel impedance matching arrangement which is suitable for use in a digital subscriber line (xDSL) modem as well as methods of operating the same.

BACKGROUND TO THE INVENTION

Line drivers such as Asymmetric Digital Subscriber Line (ADSL) drivers, Very High Speed Digital Subscriber Line (VSDL) drivers and others generally called in the art xDSL line drivers (where "x" represents the type of technology) are known. Some such prior art arrangements are discussed in, for example, Bill Schweber "Analogue front ends bridge the xDSL to real world chasm", EDN, Apr. 1, 1999; E. Nash, "Line driver design for broadband communications applications", Electronic design, Dec. 1, 1997; and from M. Steffes, "Optimising performance in an xDSL line driver", Electronic design, Apr. 19, 1999.

It is well known to provide transformer based line drivers and an example of a typical hybrid arrangement of this general type is shown with reference to FIGS. 1 to 3. In the example shown, a simple series termination is employed.

There is no unified terminology for the whole circuit, which is used to convert of an analogue signal to the appropriate line level. In one convention it is referred to as a discrete AFE (but the amplifier can be integrated). Others sources call it a line interface circuit. The term line driver is sometimes use for the complete circuit and sometimes for only part of this circuit. Although there are differences in terminology, the principles of operation remain the same. Generally, the word line driver will be used in the following when describing the invention and when used in the attached claims and it should be understood that a line driver means the circuitry that performs conversion of the analogue signal to the appropriate line level, foresees a termination impedance and eventually provides power splitting between transmitted and received signal.

FIG. 1 is a schematic block diagram of a conventional line driver comprising an amplifier 2 feeding a hybrid circuit 1 with a termination impedance 10, the hybrid circuit being for transmitting signals to and receiving signals from a transmission line 9. The hybrid circuit is assumed almost loss free. The hybrid circuit 1 has an input 11 and an output 12 to receiver circuitry. The impedance of the hybrid circuit 1 is matched to that ($Z_{ref}$) of the line 9. If the output voltage of the amplifier 2 is m.V volts and the power consumed by the circuit is P=2×V (volts)×I (amps), then the current entering the hybrid circuit 1 is 2.I/m amps. The power consumed in the line 9 is I×V. The impedance of the termination load is selected as $k^2 Z_{ref}$ and the current in the termination impedance is I/k. The power consumed in the termination load 10 is I/k×V×k=I×V, i.e. 50% of the power is lost in the termination impedance. FIGS. 2 and 3 show a conventional circuit of this type, whereby FIG. 3 shows the voltages and currents present in the circuit. An operational amplifier 2 has an input of $V_{NE}/G$ ($V_{NE}$ refers to a near end voltage) where G is the gain represented by the line signal/input signal. The output of the operational amplifier 2 is connected to the centre-tapping of a primary winding 4,5 of a splitting transformer 3 (1:1:N). A first primary winding 4 of the transformer 1:1:N (3) is terminated in known fashion to ground for load matching to the line 9 via a termination resistance R (7), giving rise to a termination impedance $Z_{ref}$.

A second primary winding 5 of the transformer 1:1:N (3) is connected to the line 9, represented here by a load 8 in the form of an equivalent resistance $R_{load}$. For transmission, a near end signal having an amplitude $V_{NE}$ is placed on the load $R_{load}$, while during reception the circuit receives a far end signal $V_{FE}$ from the line at the same point. The symmetry in the operation of the circuit can be seen clearly as the voltages and currents in the termination load and in the line are the same.

The input power to the hybrid circuit is represented by P=2.V.I and it will be apparent to the skilled person that the power dissipated in the termination impedance $Z_{ref}$ in this kind of arrangement is typically P/2, which means of course that half of the power generated is dissipated in the line driver itself.

One arrangement which improves the prior art approach of FIGS. 1 to 3 is shown in EP0901221, the disclosure of which is incorporated herein by way of reference and to which the skilled person is referred for a better understanding of known systems of this type. The arrangement of EP0901221 is suitable for matching a line driver with a predetermined load impedance, but with reduced power consumption when compared with the arrangement of FIGS. 1 to 3.

Although an improvement over the basic line driver, the arrangement of EP0901221 still requires a conventionally highly powered operational amplifier (op-amp) for its successful implementation and line driver power consumption remains at what might still be considered to be a high level. There continues to exist, therefore, a need for line driver arrangements that consume less power than some of those available to date.

SUMMARY OF THE INVENTION

It is an object of the present invention to provide an improved line driver arrangement.

It is also an object of the present invention to provide an improved method of operating a line driver.

It is also an object of the present invention to provide an improved line driver arrangement and method of operating the same which results in less wasted power dissipation.

Accordingly, the present invention provides a line driver for use with an associated load such as a transmission line, the line driver comprising a hybrid circuit, a signal portion and a termination portion connected to an output of the hybrid circuit for load matching, the termination portion including a termination impedance which is supplied in use by the hybrid circuit with a termination current, wherein said termination portion further comprises a back termination transformer, a first winding of the transformer being coupled in series with said termination resistance, a second winding of the transformer being coupled in parallel with said termination impedance so that a portion of the voltage dropped across the termination portion is dropped across the first winding to thereby cause the power dissipated in said termination impedance to be less than the power available to the signal transmission portion for signal transmission to the load, e.g. to an associated transmission line. To provide input impedance matching to the associated load (transmission line), a feedback circuit is provided to feedback current from the signal portion to an input of the hybrid circuit.

The present invention may also provide a line driver for use with an associated load such as a transmission line comprising a termination portion which includes a termination impedance and which is supplied in use by an associated amplifier, preferably in the form of an operational amplifier (op-amp), with a termination current for load matching, wherein said termination portion further comprises a back-termination transformer which is coupled with said termination impedance so that a current is injected into the termination portion via a winding of the back termination transformer, whereby the power dissipated in said termination impedance is less than the power available to a signal transmission portion for signal transmission to the associated load, e.g. to the associated transmission line.

The power dissipated in the termination portion compared to the power available in the load (transmission line) is one of at least 10% less, at least 20% less, at least 30% less, at least 40% less, or at least 50% less, A back termination current may be induced in a winding of said back-termination transformer and may be fed back towards the output of said amplifier, whereby a portion of said termination current is recovered. The output of said amplifier may be reduced in proportion to said recovered current.

The impedance of a component of said termination portion may be scaled with respect to at least one of a turns ratio of a line transformer (1:1:N) and the impedance of said associated load (transmission line).

The value of said termination impedance may be lower than a characteristic impedance of said associated load (transmission line) by a factor in proportion to the turns ratio of said back termination transformer. A turns ratio of said back-termination transformer may be between 0 and 1.

During a receive operation, a portion of a current derived from a far end voltage may be fed back into an input of said amplifier in a proportion which is arranged to control the output of said amplifier in such a manner that correct input impedance matching from said termination portion is ensured during signal reception.

The receive operation feedback may be supplied from a node where the voltage level is substantially independent of the transmitted signal in a preferred but not mandatory aspect of the present invention, whereby a back-termination is implemented in such a manner that gain and stability during a transmit operation are substantially unaffected by said feedback.

Said termination impedance may be coupled in series with a primary winding of said back-termination transformer. Said termination impedance may be coupled in series with a secondary winding of said back-termination transformer. The value of said termination impedance may be determined in accordance with the equation $R_{term}=R_{load} \cdot (1-\alpha)$, in which $R_{load}$ is the impedance of the load (e.g. a line impedance) and $\alpha$ is a turns ratio of said back-termination transformer. Said amplifier is preferable built with an operational amplifier and it has a gain (A) in accordance with the equation $A=2(1-\alpha)/(2-\alpha)$, in which $\alpha$ is the turns ratio of said back-termination transformer.

Said hybrid circuit may be adapted such that the voltages at the termination port are scaled by a factor k, the currents by a factor 1/k, the associated turns ratios by a factor k and the impedances by a factor $k^2$. The hybrid circuit may be adapted such that the voltage at the hybrid input, which is connected to said amplifier, is scaled by a factor m, the currents by a factor 1/m, the associated turns ratios by a factor m and the impedances by a factor $m^2$.

Said back-termination transformer may comprise an autotransformer.

Said back-termination transformer may be included in a feedback loop which provides feedback to the input side of said amplifier, said amplifier being implemented using an operational amplifier which operates off a low voltage supply, such as for example a voltage in the region of +/−5 or 6V.

A secondary winding of said back-termination transformer may be serially coupled with a primary winding of a line matching transformer of said line driver. Said line matching transformer may comprise a splitting transformer, a first primary winding of which is coupled in series with said secondary winding of said back-termination transformer and a second primary winding of which is coupled to a load. A secondary winding of said line-matching transformer might be coupled to receiving circuitry. Said line matching transformer may be operated as a common-mode choke.

Said back termination transformer may be integrated with a transmission line transformer. In this case a complete front end can be implemented using only two transformers, with the back-termination transformer incorporated in such a transmit-transformer.

The nominal output power of said line driver may be in the region of $(2-\alpha) \cdot V_{NE}^2/R_{term}$, in which: $\alpha$ is the turns ratio of said back-termination transformer (1:$\alpha$); $V_{NE}$ is the near-end voltage of said line driver; and $R_{term}$ is the value of said termination resistance.

In an xDSL network, said line driver may be implemented at a customer premises (CPE).

The present invention provides a method of operating a line driver for use with an associated load such as a transmission line, said line driver comprising, a hybrid circuit, a signal portion and a termination portion which includes a termination impedance and a back-termination transformer which is coupled with said termination impedance, the method including dropping across a winding of the back transformer a portion of a voltage dropped across the termination portion to thereby cause the power dissipated in said termination impedance to be less than the power available to the signal transmission portion for signal transmission to the load, e.g. to the associated transmission line. To provide input impedance matching to the associated load (transmission line), a feedback circuit is fed back current from the signal portion to an input of the hybrid circuit.

The present invention also provides a method of operating a line driver for use with an associated load (transmission line), said line driver comprising a termination portion which includes a termination impedance and a back-termination transformer which is coupled with said termination impedance, the method including recovering with said back-termination transformer a portion of a termination current and feeding the recovered current back in to a current supply from which at least a portion of said termination current is derived.

The method may include dissipating in said termination impedance less power than is dissipated in an associated load impedance (line impedance).

The method may include feeding back into a current generator during a receive operation an impedance synthesising current derived from a far-end voltage and thereby synthesising during a said receive operation a preferred line matching impedance in said termination portion.

The method may include feeding back said impedance synthesising current from a node whose current level is independent of transmitted signals.

The present invention also provides a modem suitable for broadband communication, preferably an xDSL modem, including a line driver according to the apparatus of the invention and/or including a line driver which operates in accordance with the method of the invention.

BRIEF DESCRIPTION OF THE DRAWINGS

The present invention will now be described by way of example only and with reference to the accompanying drawings, in which.

DETAILED DESCRIPTION OF ILLUSTRATIVE EMBODIMENTS

The present invention will be described with reference to certain embodiments and drawings but is not limited thereto but only by the attached claims. In the following the load on the line driver is shown as a transmission line but the present invention is not limited thereto.

Figure 3:
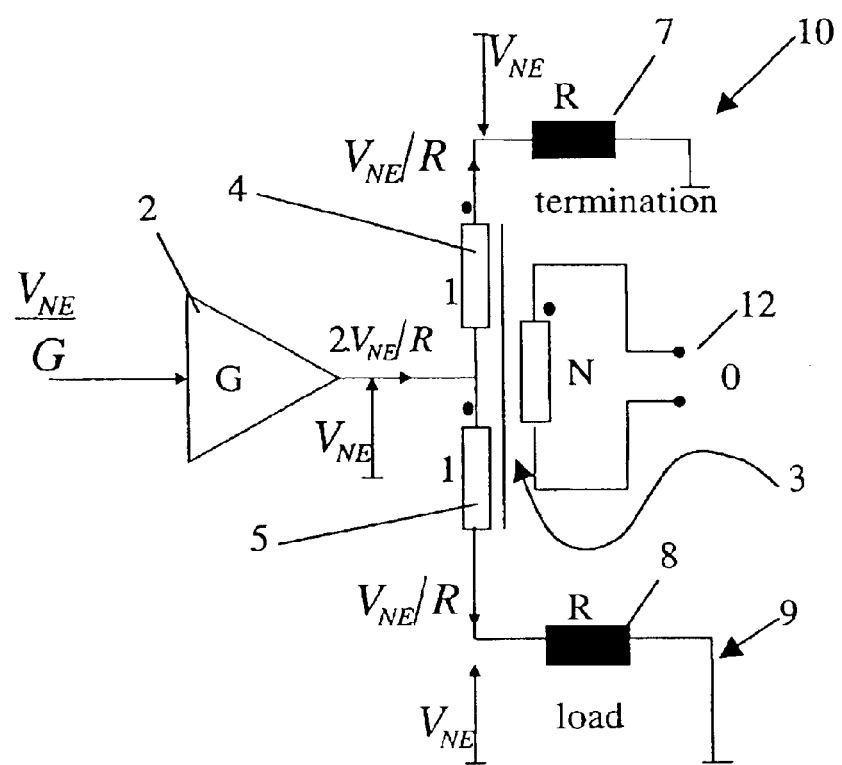
Figure 4:
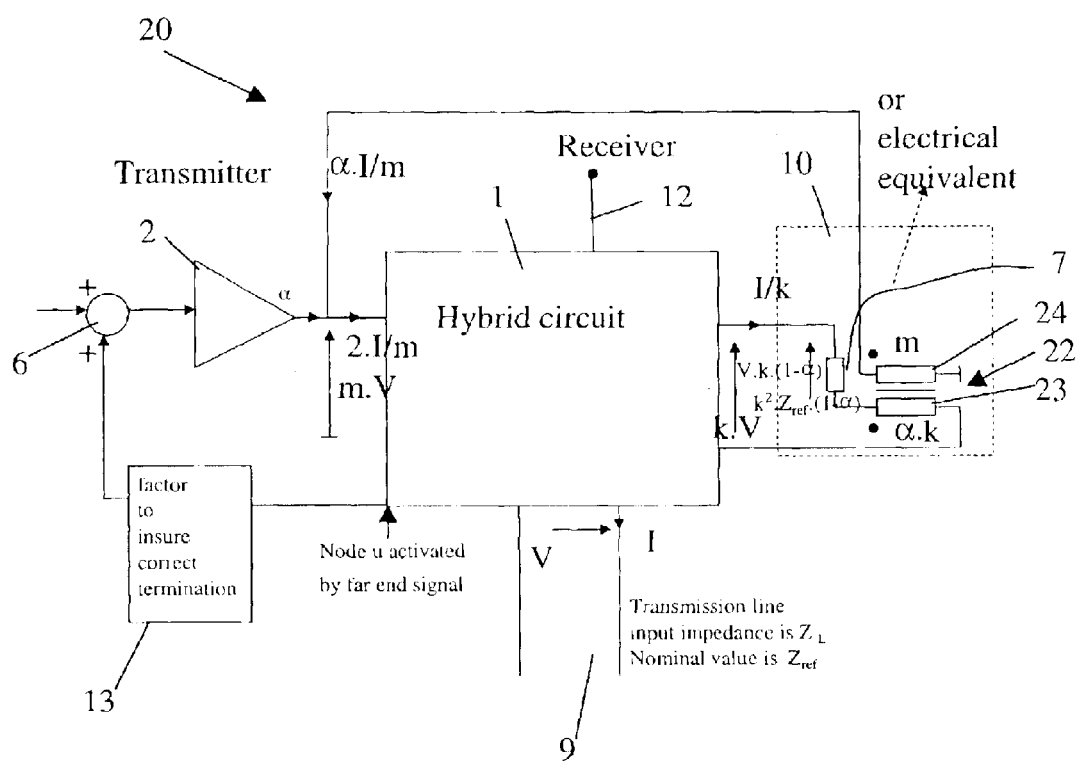
FIGS. 4 to 7 are schematic circuits of an embodiment of the present invention.
Figure 7:
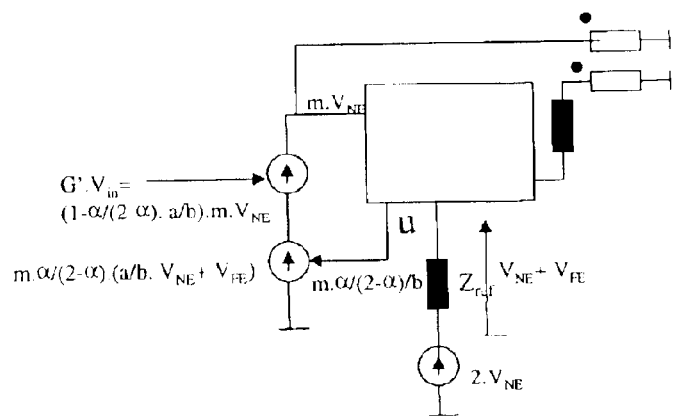
Figure 8:
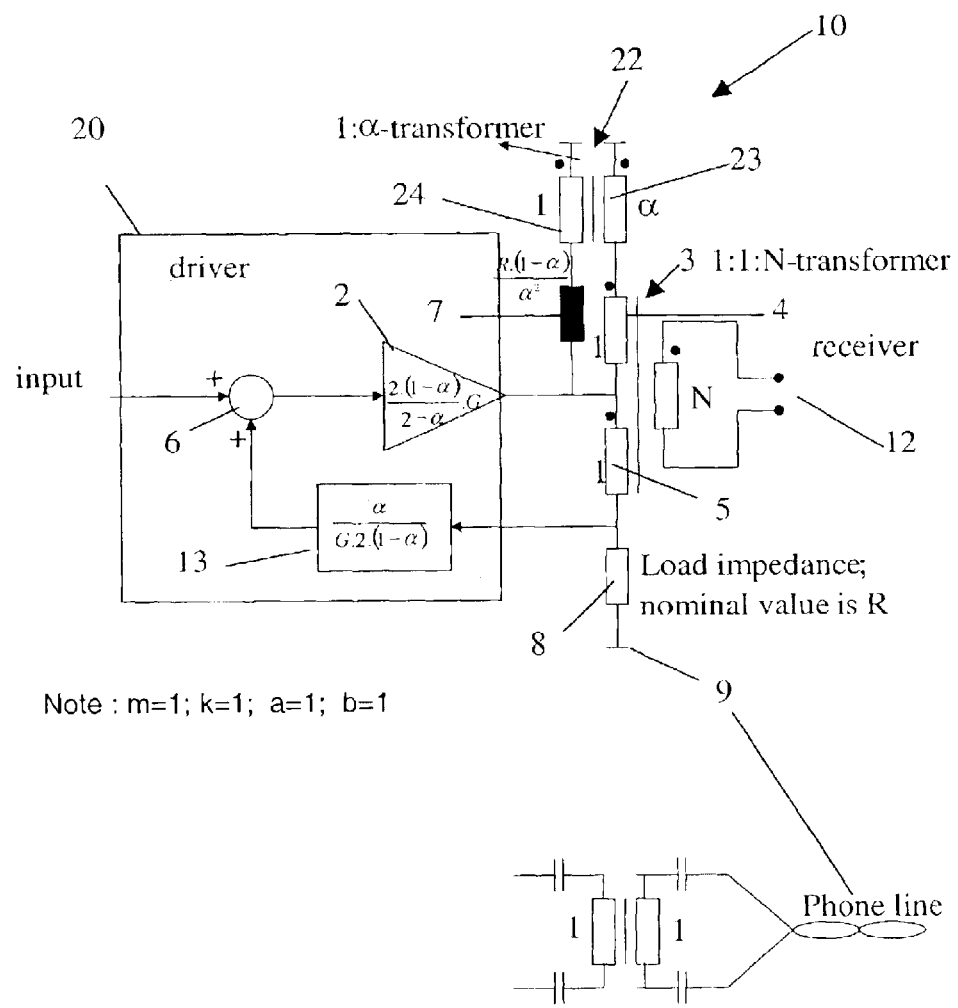
FIG. 8 is a diagram of a line driver according to one embodiment of the present invention, the smaller diagram lower right showing an equivalent circuit thereof.
Figure 9:
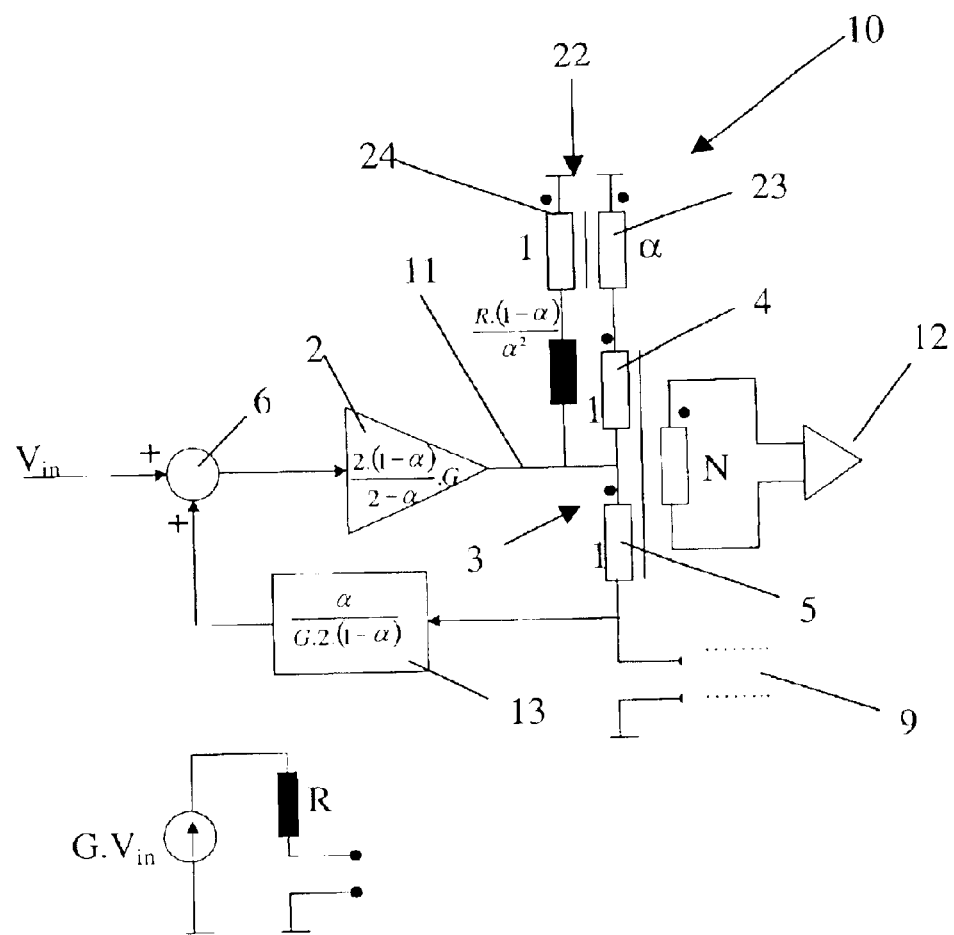
FIG. 9 is an equivalent circuit of the line driver of FIG. 8, with respect to the line port, the small diagram on the bottom left showing a detailed equivalent circuit of the termination portion.

Referring in particular to FIG. 4, a first general embodiment of a line driver 20 in accordance with the present invention will be described. An input of the line driver 20 is supplied to an amplifier 2, e.g. an op-amp. The amplifier feeds a hybrid circuit 1 which may be assumed to be loss free. An output 12 of the hybrid circuit is fed to a receiver. Another output side of the hybrid circuit 1 is connected to a termination portion 10 comprising a termination impedance 7 and a back transformer 22 or electrical equivalents thereof. The back transformer has a turns ratio of m:α.k where m, α and k are constants. A further output of the hybrid circuit 1 is connected to a load such as a transmission line 9. The voltage supplied by the amplifier 2 can be designated as mV volts. The current output by the amplifier 2 is 2.I.(1−a/2)/m. The current returned from the winding 24 of the back transformer to the output of the amplifier 2 is αI/m. There is a voltage across the termination portion 10 of kV. Across the winding 23 of transformer 22 there is a voltage of k.α.V. The voltage over the remaining balance impedance is (k.V−k.α.V). It can be seen that a portion of the voltage dropped across the termination portion 10 is dropped across one of the windings of the back-termination transformer 22 thus leading to a reduction in voltage across the impedance 7. The current through the termination impedance is I/k and therefore the impedance $R_{term}$ now used in the termination portion 10 becomes equal to the load impedance $R_{load}$ of FIG. 1 multiplied by the factor $k^2.(1-\alpha)$. The reduction in the required value of the termination resistor $R_{term}$ provides another part of the power saving of the present invention. The total power dissipated in the circuit is P=2.V.I. (1−α/2), that is a reduction of power of α/2 compared with the arrangement of FIGS. 1 to 3, 16 and 19. The gain of amplifier 2 is $$G' = \frac{m \cdot (2 \cdot b - \alpha \cdot (a+b))}{(2-\alpha) \cdot b} \cdot G$$

where G is the gain represented by the line signal/input signal. The gain of the amplifier G' should be set to get the desired gain from input to line. The calculation of this gain is shown in FIG. 7.

During a receive operation, however, the termination impedance 7 for matching the load impedance, e.g. a transmission line impedance, in this embodiment is equal to $(1-\alpha).Z_{ref}$ instead of being equal to the value $Z_{ref}$ as preferred for line matching. To compensate for this shortfall in line balance during reception, the active element of the line driver, the op-amp 2, is used to synthesise the right impedance in the termination. Thus active feedback is used to compensate for this difference in impedance. To achieve this a feed back 13 is provided from a node u of the hybrid circuit 1 to an input of the amplifier 2, e.g. via an adder 6. The feedback factor is given by:

$$\frac{m \cdot \alpha}{(2-\alpha) \cdot b \cdot G'}$$

Figure 6:
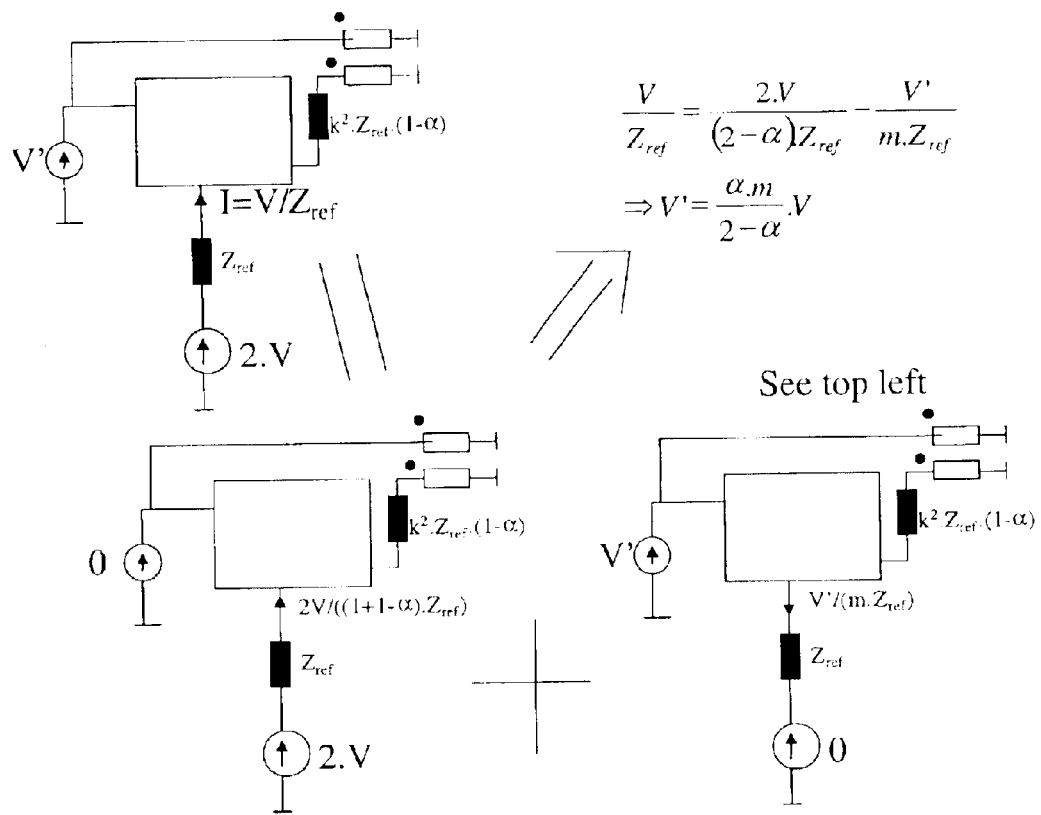

The calculation of the compensation feedback 13 is shown with particular reference to FIG. 6, in which the transmission line 9 is replaced by its Thevenin equivalent circuit for an incident wave of amplitude V:

$$\frac{V}{Z_{ref}} = \frac{2 \cdot V}{(2-\alpha) \cdot Z_{ref}} - \frac{V'}{m \cdot Z_{ref}} \Rightarrow$$

$$V' = \frac{\alpha \cdot m}{2-\alpha} \cdot V$$

The two cases shown in the lower part of the figure (on the left with a far end voltage of 2V is applied to the signal portion of the hybrid circuit and on the right with a voltage V' applied to the hybrid circuit by the amplifier 2) are superposed to form the equivalent circuit top left. The input impedance of the hybrid circuit 1 at the transmission line termination is $(1-\alpha).Z_{ref}$. This demonstrates, using FIG. 6, that the factor for proper termination during reception (i.e. an input impedance equal to $Z_{ref}$) is m.α/(2−α).

Figure 5:
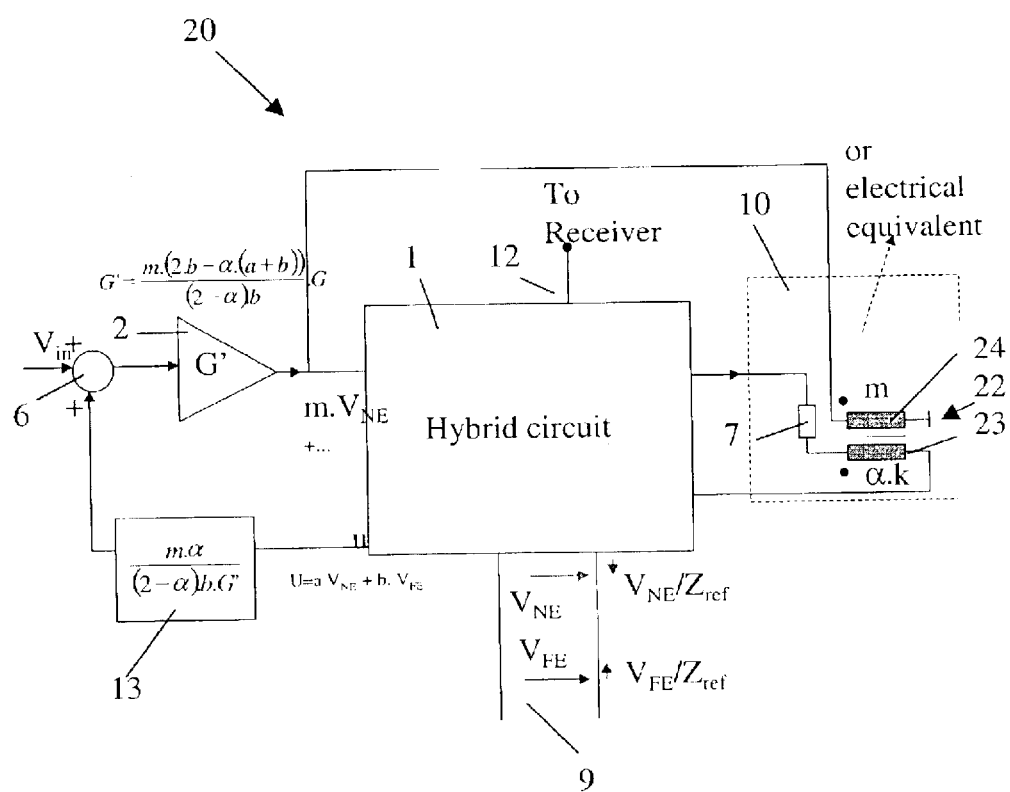

To generate this signal at the output of the op-amp 2, it is necessary to use the signal at some node "u" which includes a combination of transmitted and received signals. Referring to the transmitted signal as the near-end voltage $V_{NE}$ and to the received signal (i.e. an incident wave) as the far-end-voltage $V_{FE}$, we can define the voltage at this node u by the expression $U=a.V_{NE}+b.V_{FE}$ where a and b are constants. In this manner the right termination is obtained if $V'=U.m.\alpha/(2-\alpha).b$. By selecting the appropriate values of a and b circuits can be designed which have reduced power dissipation while maintaining impedance matching on receive. It should be noted, however, that if "a" is not equal to zero, the gain in the transmitted direction will also be affected. The manner in which account is taken of this is shown with particular reference to FIG. 7, the end effects also being shown with particular reference to FIG. 5. A part of the input voltage is directly related to the transmitter input and the rest is caused by the termination factor.

Figure 1:
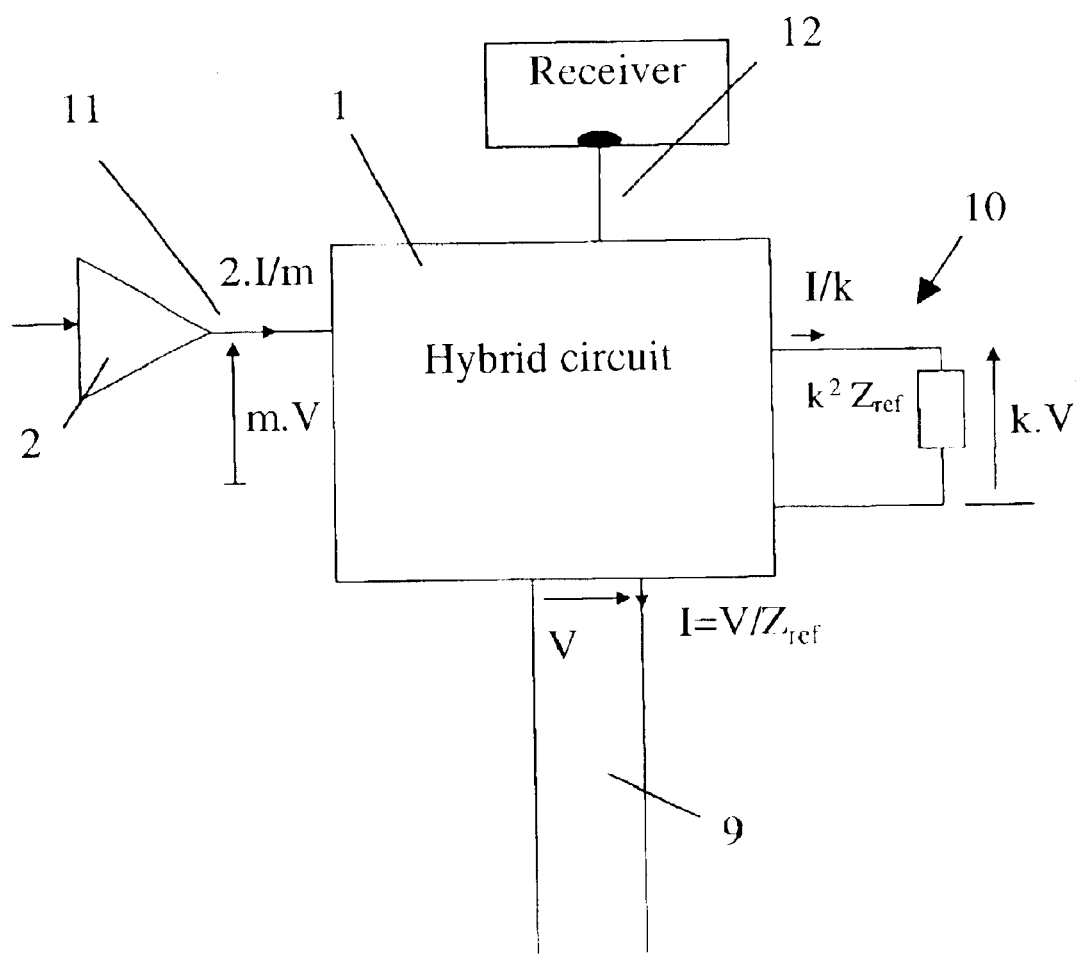
FIGS. 1 to 3 show a prior art line driver arrangement, as discussed in the introduction, the smaller diagram lower left in FIG. 2 showing an equivalent circuit.
Figure 2:
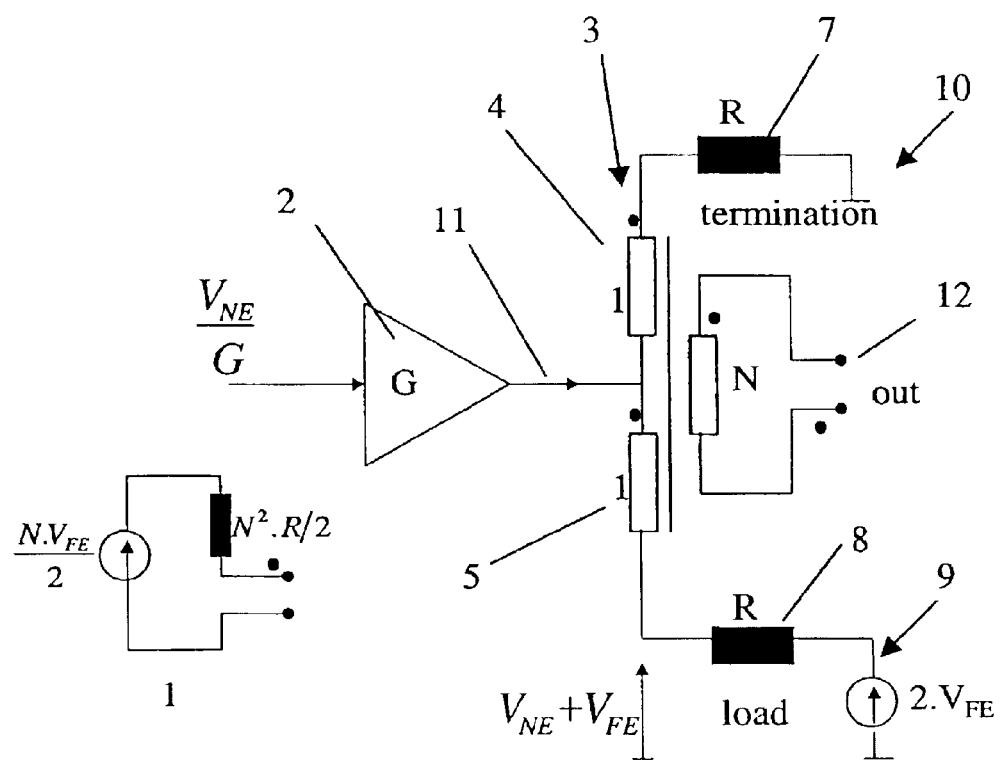

In the above circuit analysis, the node "u" may be chosen as an embodiment of the present invention such that its value is independent of the transmitted signal, a back-termination can be implemented by feeding back a synthesising current in such a manner that the gain and stability during transmission are not effected by that feedback. By way of example, if a=0 the stability and gain requirements of the amplifier 2 will be substantially the same as those of the traditional implementation. Referring also to FIGS. 1 to 3 for comparison, a line driver 20 of a further embodiment of the present invention disclosed with reference to FIGS. 8 to 12 is similar in structure to the arrangement of FIGS. 1 to 3, 16 and 19, save that the termination portion is modified so as to reduce power dissipated in the circuit. The constants m, k, a, and b mentioned in the previous embodiment have all been set to 1 in this embodiment. It will be appreciated that the skilled person can extend the present invention to other values of m, k, a and b. The hybrid circuit 1 comprises an output transformer 3 and an amplifier 2 which is preferably in the form of a low-power (e.g. +/-5 to 6V) operational amplifier (op-amp) having a gain given by $$\frac{2 \cdot (1 - \alpha)}{2 - \alpha} \cdot G$$

where G is the gain represented by the line signal/input signal. The gain of the amplifier should be set to get the desired gain from input to line. Feedback 13 is available during a receive operation from the second primary winding 5 of the line matching transformer (1:1:N) 3 to the input of a amplifier 2. The feedback factor is:

$$\frac{\alpha}{G \cdot 2 \cdot (1 - \alpha)}$$

Figure 10A:
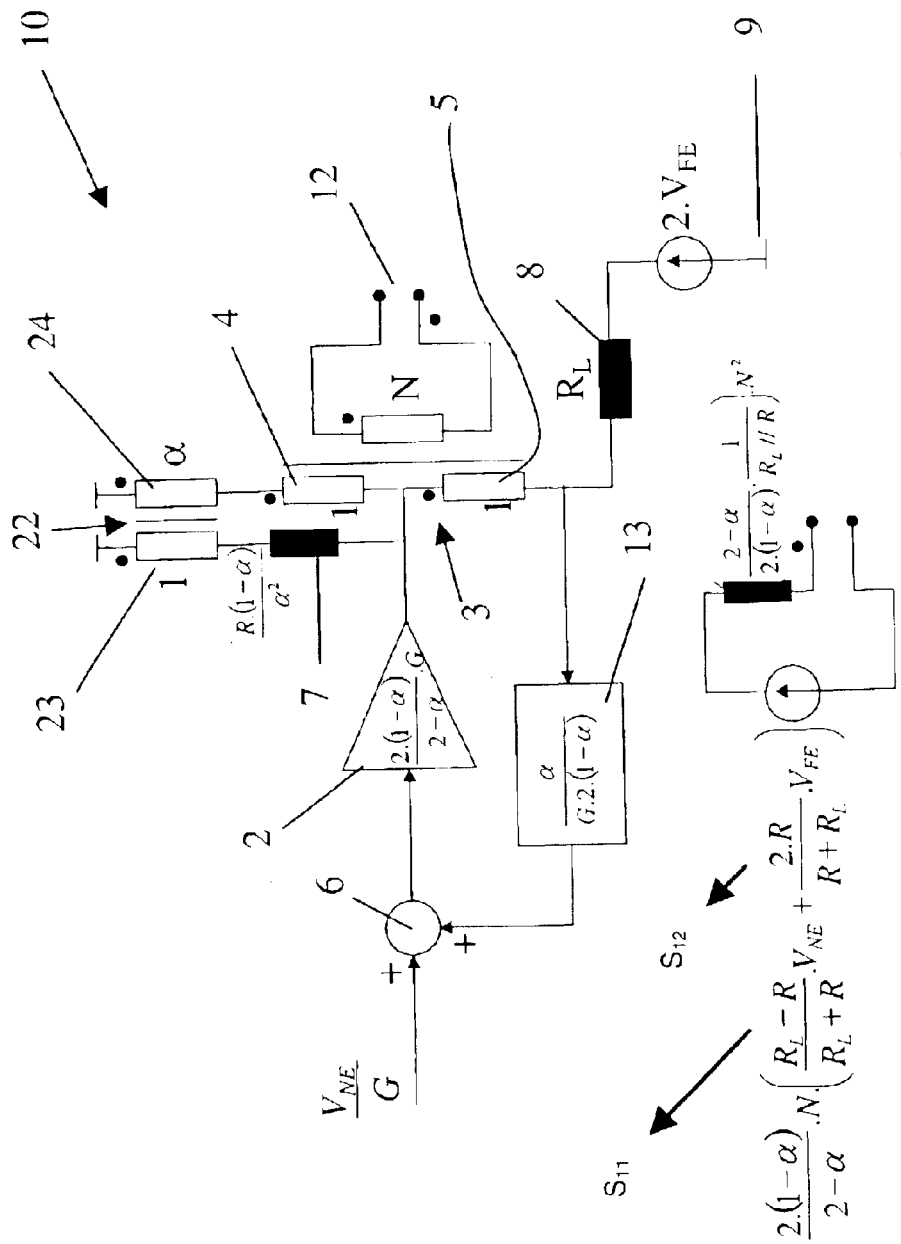
FIGS. 10a to 10d are equivalent circuits of the line driver of FIG. 8, with respect to the receiver port.
Figure 10B:
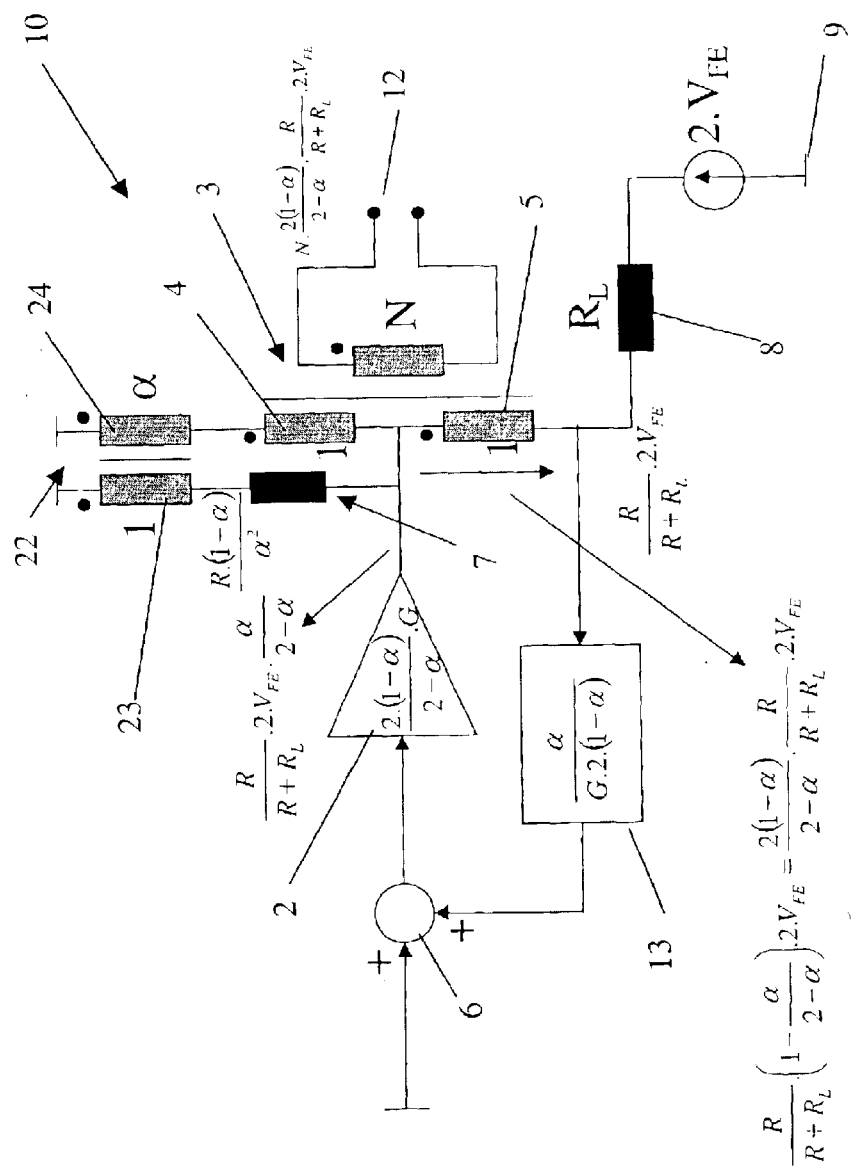
Figure 10C:
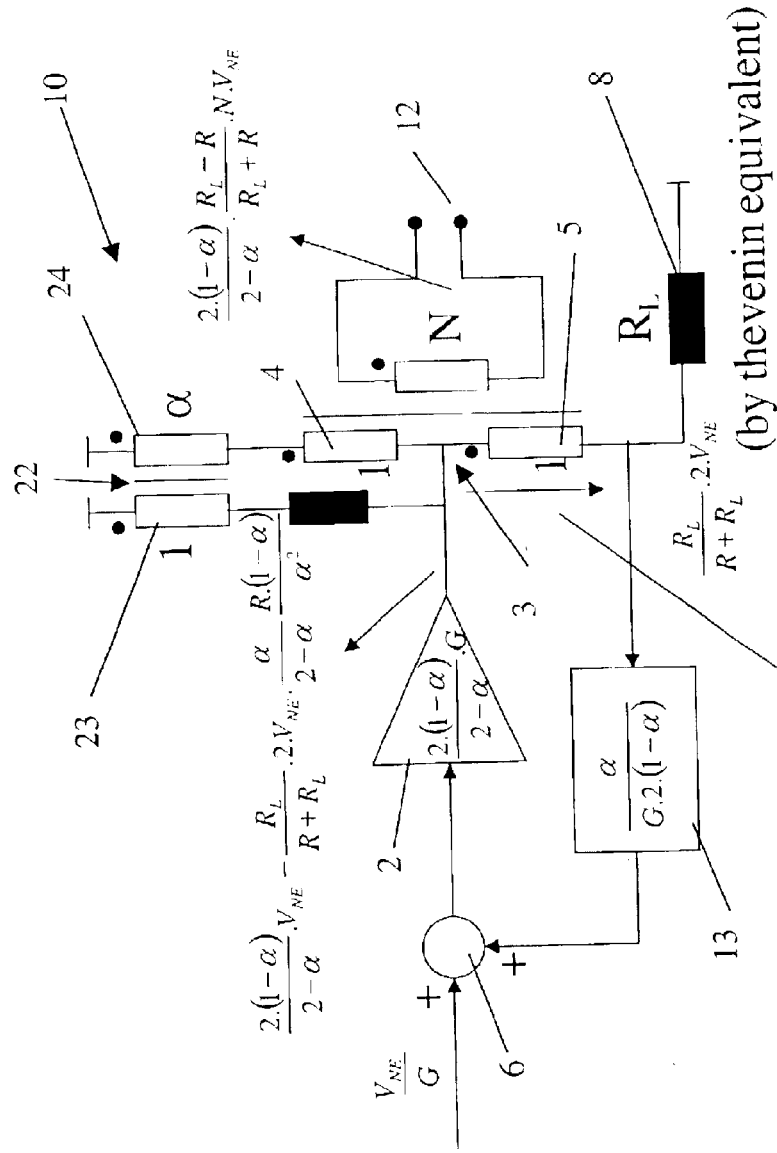
Figure 10D:
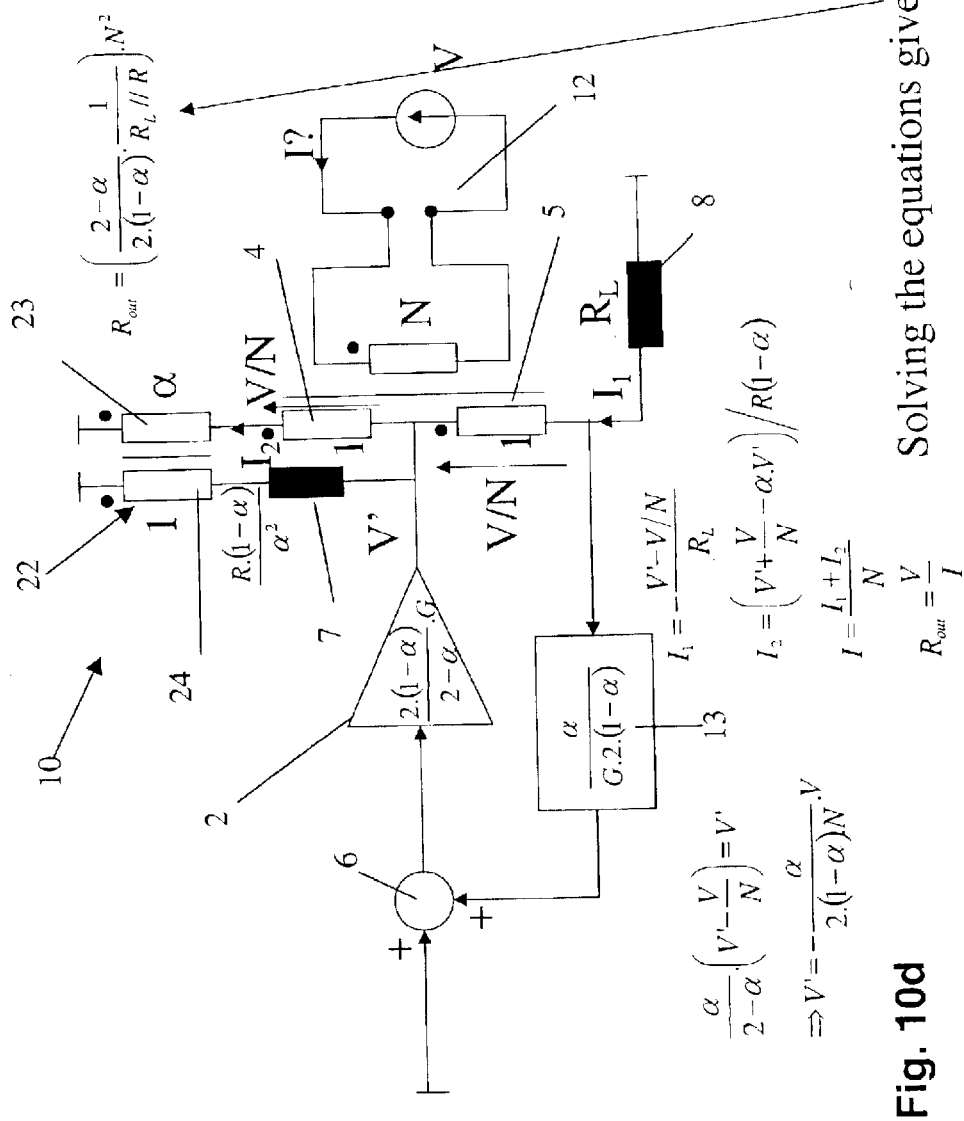

The modification to the termination portion 10 comprises the inclusion of a transformer (1:α) 22 which is adapted to recover at least a portion of the current $V_{NE}/R$ fed from the op-amp 2 into the termination portion 10 (represented as $I_2$ in FIG. 10d). This transformer 22 has a turns ratio of 1:α, where α is between 0 and 1 and is defined as a back termination factor which represents the proportion of the termination current $V_{NE}/R$ which is recovered from the termination portion and fed back towards the output of the op-amp 2. Because this transformer (1:α) is feeding back current from the termination portion, it is referred to for convenience as a back-termination transformer (1:α) and the current $\alpha.V_{NE}/R$ it is feeding back into the output of the op-amp 2 as a back-termination current.

In an alternative description of the invention a back termination transformer is provided, one winding of the back transformer being in parallel with the termination resistor 7 and a second winding 24 of the back termination transformer being coupled in series with the termination resistor 7. A portion of the voltage dropped across the termination portion 10 is dropped across the second winding 24 so that the voltage drop across the resistor 7 is reduced compared to the known line driver of FIGS. 1 to 3. Hence, the power dissipated in the resistor 7 is less than the power delivered to the transmission line 9.

Accordingly, the termination resistance $R_{term}$ is coupled in series between a primary winding 24 of the back-termination transformer (1:α) 22 and the current supply $2.V_{NE}/R$ from the output of the op-amp 2 to the centre tap of the line matching splitting transformer (1:1:N) 3. The secondary winding 23 of the back-termination transformer (1:α) 22 is series coupled with a first primary winding 4 of the splitting transformer (1:1:N) 3, the second primary winding 5 of which is series coupled with a load impedance 8 having a nominal value $R_{load}$ representing the transmission line 9.

The total current fed into the centre-tap is $2.V_{NE}/R$, which is then split into two equal portions each of value $V_{NE}/R$. These currents then go one each into the first and second primary windings 4, 5 of the splitting transformer (1:1:N) 3. The current which goes through the second primary winding 5 and into the load 8 can also be represented by $V_{NE}/R_{load}$.

The other part of the current entering the centre-tap travels up in to the termination portion 10 through the first primary winding 4 of the splitting transformer (1:1:N) and also through the secondary winding 23 of the back-termination transformer (1:α) 22. It induces in the primary winding 24 of the back-termination transformer (1:α) 22 a back termination current which is in proportion to the turns ratio (α) of that transformer (1:α) 22 and can be represented by either of $\alpha.I$ or $\alpha.V_{NE}/R$.

With particular reference to FIG. 10a, it will be noted that the hybrid circuit is constructed such that the signal at the receiver terminal 12 becomes $K.(S_{11}.V_{NE}+S_{12}.V_{FE})$, where $V_{NE}$ and $V_{FE}$ represent the near and far end voltages respectively (i.e. transmitted and received signals). The S-parameters apply on the transmission medium between the line terminals of the hybrid at either side and have the output impedance of the line port of the relevant line as a reference impedance. K is a scaling factor determined by specific parameters of the circuit, such as for example the turns ratio of the line transformer (1:1:N) 3 and/or the impedance of the transmission line 9.

Figure 11:
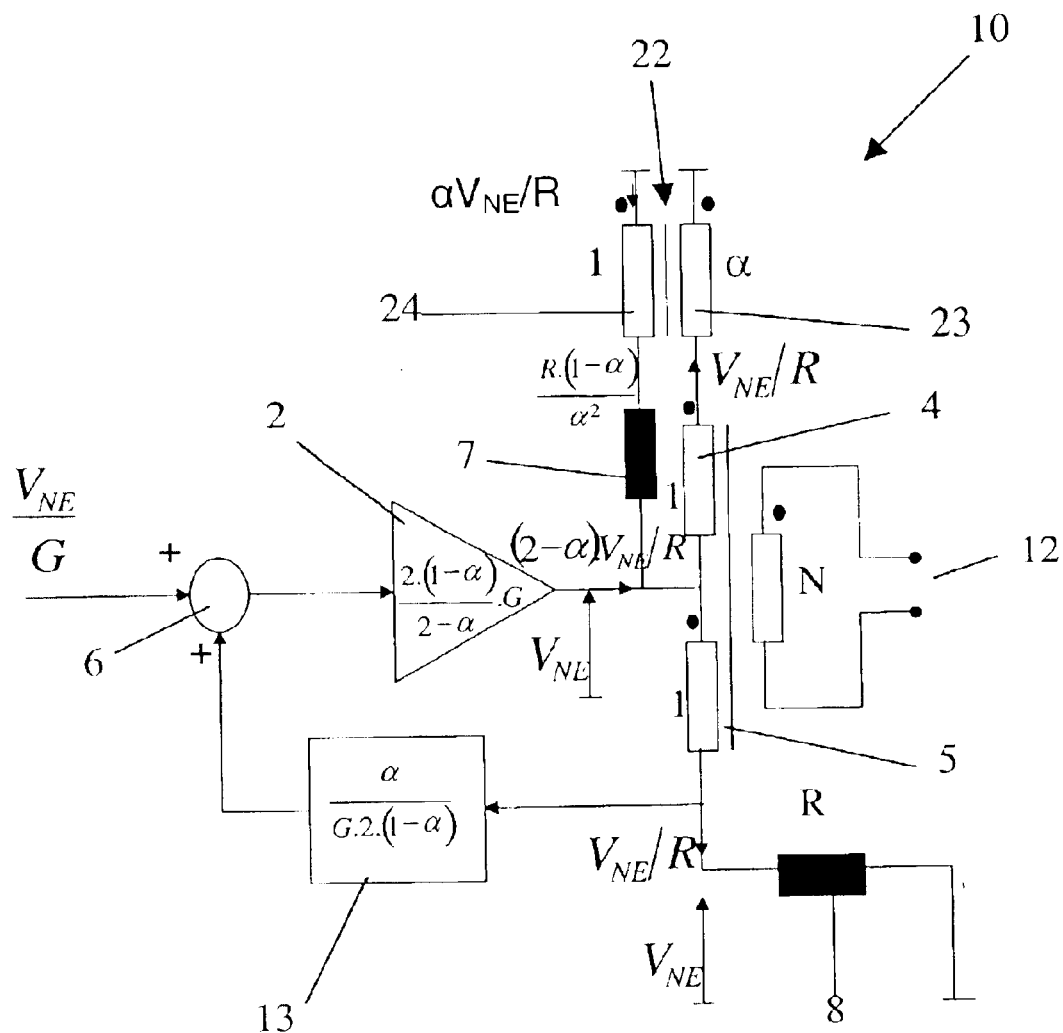
FIG. 11 shows the circuit of FIG. 8 in use with signal levels applied.

In FIG. 11, it can be seen that the back-termination current $\alpha.V_{NE}/R$, travels down through the termination resistance 7 $R_{term}$ and joins the current $2.V_{NE}/R$ being supplied to the centre-tap by the op-amp 2. This gives back to the active element (op-amp 2) at least a portion of the termination current $V_{NE}/R$ and reduces the current which must be produced by the op-amp 2 to $(2-\alpha)V_{NE}/R$. The currents and voltages in the termination portion, however, are maintained at the levels appropriate to ensure that balance with the line 9 is not lost.

The induction in the primary winding 24 of the back-termination transformer (1:α) of the back-termination current $\alpha.V_{NE}/R$ inevitably leads to a portion of the termination voltage being dropped across that winding. This reduces the voltage drop across the termination resistor 7 thus reducing the power developed in the termination portion being consumed in that component to less than P/2. This means that of the total power developed by the termination current $V_{NE}/R$ in the termination portion 10, the proportion dissipated in the termination resistor 7 $R_{term}$ is lower than the power available for signal transmission to the load 8 $R_{load}$ and that therefore less than half the power is dissipated in the termination resistance 7 $R_{term}$ of a line driver arrangement according to the present invention. The value of the termination resistor 7 $R_{term}$ is therefore lower than the nominal value of the load impedance 8 $R_{load}$, by a factor of $(1-\alpha)/\alpha^2$ in this embodiment.

During a receive operation, however, a reduced value of termination resistor 7 $R_{term}$ may result in improper impedance matching between the line driver and the line 9 (load 8). To correct this deficit and to ensure that there is correct impedance matching during reception, feedback 13 is provided from the line side of the second primary 5 of the splitting transformer (1:1:N) 3 to the input of the op-amp 2. The proportion of feedback 13 provided is in accordance with the equation $\alpha/G.2.(1-\alpha)$, where G is the gain from input to line.

Figure 12:
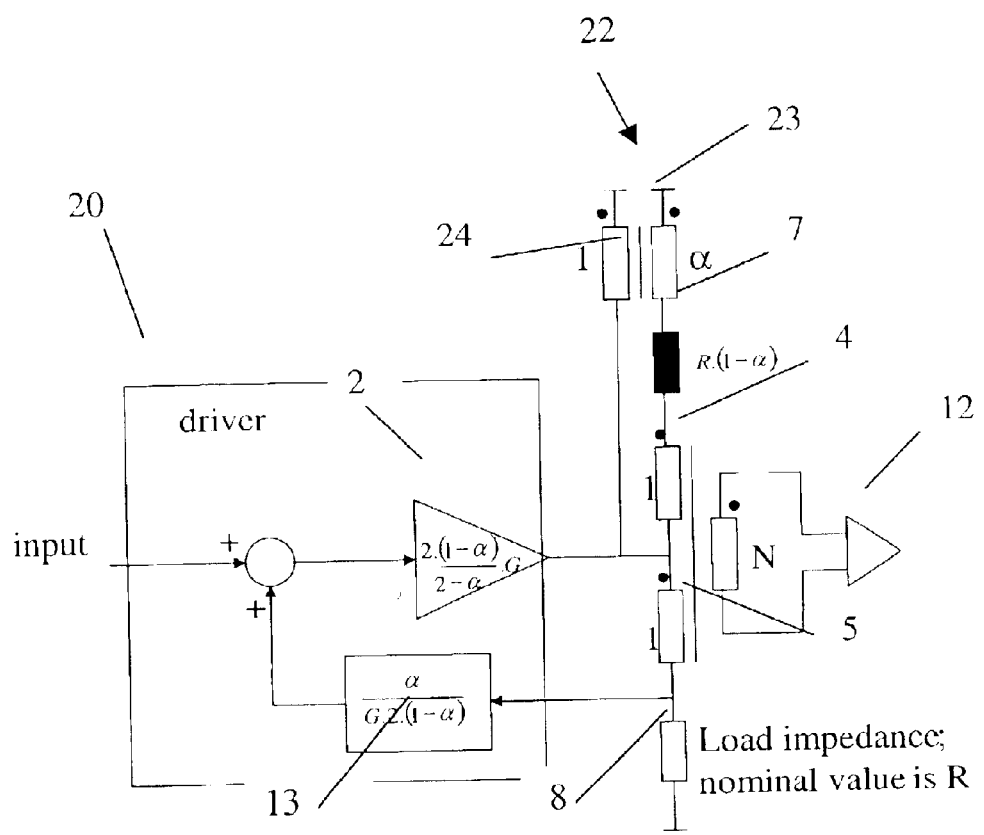
FIG. 12 is a diagram of a second embodiment of the invention.

Referring now in particular to FIG. 12 a further embodiment of the invention will be described. Reference numbers which are the same in FIGS. 12 and 4 to 11 refer to the same or equivalent components. The termination resistor 7 $R_{term}$ is included in series with the secondary winding 23 of the back-termination transformer $(1:\alpha)$ 22, rather than in series with its primary winding 24 as in the previous embodiment. In this embodiment, the value of the termination resistor 7 $R_{term}$ is derived in accordance with the equation $R_{term} = R_{load}.(1-\alpha)$ and it can be seen that a power dissipation saving is still achieved.

The object of the back-termination in any of the embodiments can be seen as recovering at least a portion of the current $V_{NE}/R$ which travels through the termination portion and to provide a least a part $\alpha.V_{NE}/R$ of the recovered current to the output of the op-amp 2, such that the power dissipated in the termination resistor 7 $R_{term}$ is lower than the power available for transmission to the transmission line 9. Alternatively it can be seen as dropping a portion of the total voltage across the termination portion across the winding of a transformer such that the voltage drop across the termination resistance is reduced.

In an arrangement according to FIGS. 1 to 3, the termination current $V_{NE}/R$ is lost to the line driver as a result of the power dissipated in the termination resistance whereas, in an arrangement according to the present invention, at least a portion, of this current is recovered and returned to the active element while keeping in use the same currents and voltages at the hybrid terminals, such that balance with the line is maintained.

Figure 13:
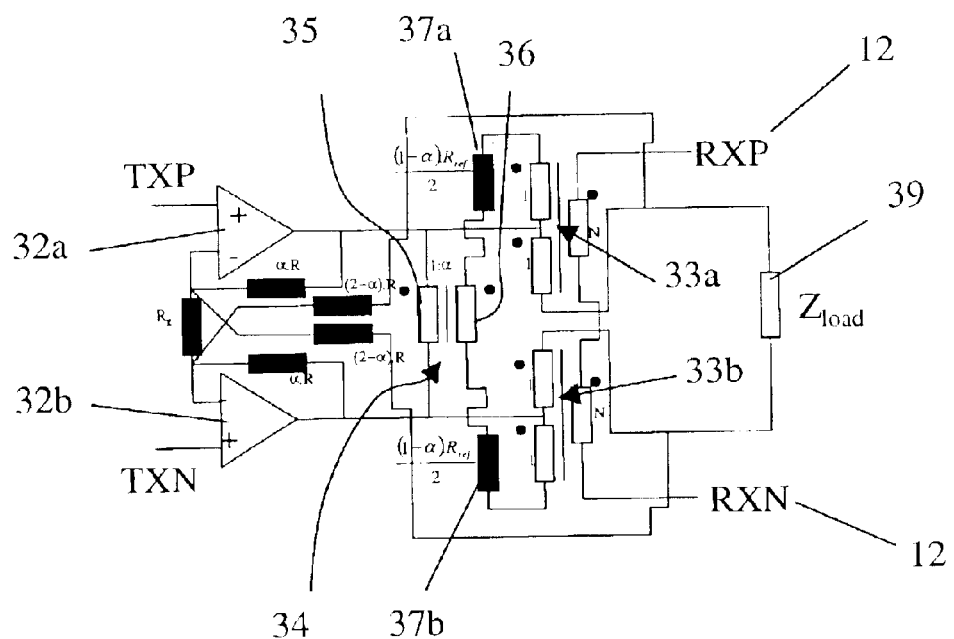
FIG. 13 shows a further embodiment of the present invention.

A further embodiment of the present invention will be described with reference to FIG. 13. Two opamps 32a and 32b have their outputs connected to a winding 35 of a 1:α back termination transformer 34. The other winding 36 of the back termination transformer 34 is connected in series with one terminal of termination resistors 37a and 37b, respectively. The other terminals of the termination resistors 37a, 37b are connected to one side of primary windings of 1:n splitting transformers 33a and 33b respectively. The other side of these primary windings are connected to a load such as a transmission line 39 having an impedance represented by $Z_{load}$. To provide feedback to the inputs of the op-amps 32a and 32b (as required in accordance with this invention to provide impedance matching) a back termination impedance network 40 is provided.

Figure 14:
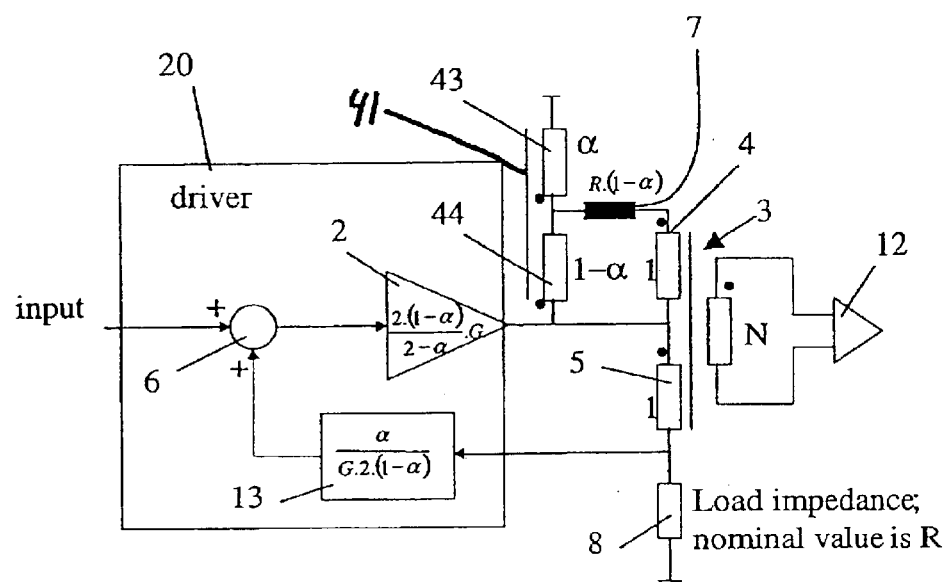
FIGS. 14 and 15 each show further embodiments of the present invention.
Figure 15:
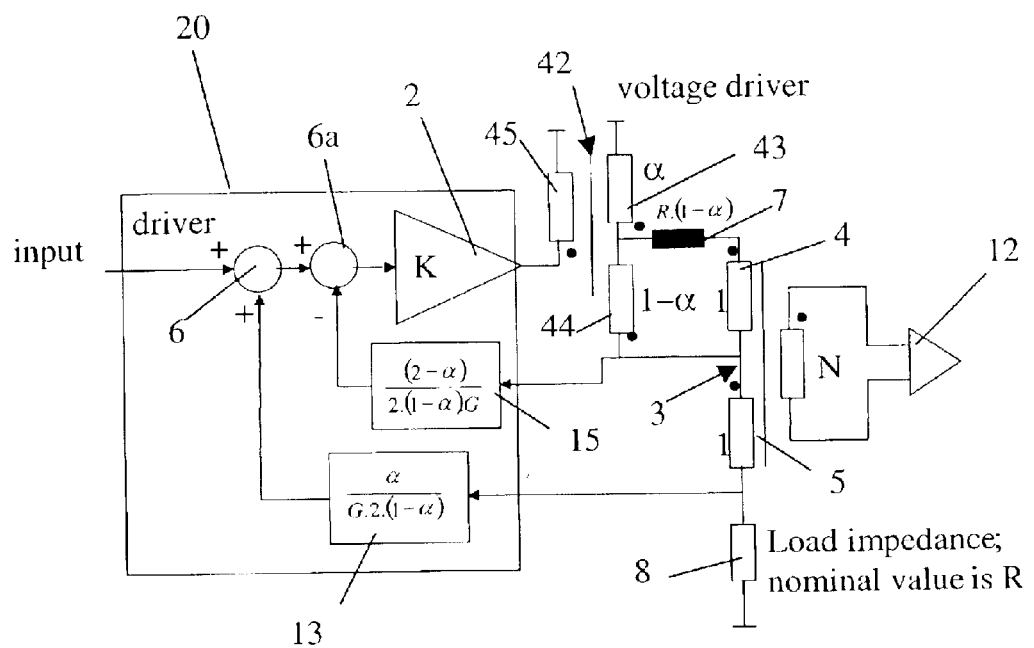

Further embodiments of the invention are disclosed in schematic form in FIGS. 14 and 15, in which an auto-transformer implementation and a low voltage implementation are shown respectively. Reference numbers in FIGS. 14 and 15 which are the same as in previous embodiments relate to the same components. With reference to FIG. 14, the output of the opamp 2 is connected to the centre tapping of the 1:n transformer 3. A 1–α:α auto-transformer 41 is connected to the output of opamp 2. A termination resistor 7 is connected between the 1:n transformer 3 and a centre tapping of the autotransformer 41. Hence, one winding 43 of autotransformer 41 is connected in series with the termination resistor 7 and the other winding 44 is connected in parallel. Also, the current to ground through the autotransformer 41 induces a voltage across one of its windings 43 which reduces the voltage drop across the termination resistor 7 thus reducing its power consumption—an aspect of all the embodiments of the present invention. Again feedback 13 is provided to match receive impedance.

To achieve the low voltage embodiment as shown in FIG. 15 the output of the amplifier 2 is connected to a primary winding 45 of a back transformer 42 whose secondary windings have a turn ratio of 1–α:α. The termination impedance 7 is connected between a centre tapping of the back transformer secondary windings 43, 44 and a primary winding 4 of a splitting (1:n) transformer 3. The back-termination transformer 42 is included in a feedback loop which provides feedback 15 to the input side of the op-amp 2, such that the line driver can be implemented using an operational amplifier 2 which operates off a low voltage supply, such as for example a voltage in the region of +/–5 or 6V. The gain K of the opamp 2 is assumed very large. The negative feedback 15

$$\frac{(2-\alpha)}{2 \cdot (1-\alpha) \cdot G}$$

determines the amplification factor of the amplifier 2 as well as feedback 13 which is positive feedback as it is added (6) to the input of the opamp 2 whereas 15 is negative feedback (6a). The nullator operation of the amplifier imposes a voltage at node 3 equal to the amplifier output voltages of FIG. 12. The auto-transformer two-port (43,44) is equivalent to the transformer (7, 24) at FIG. 12. So the operation will be equivalent.

Figure 16:
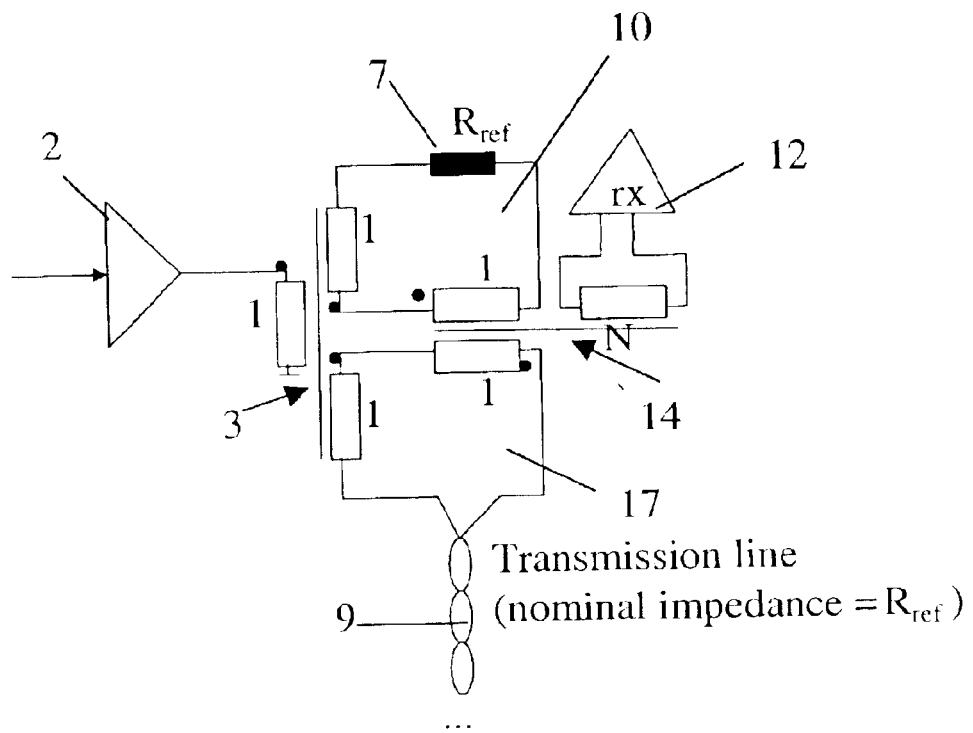
FIG. 16 shows a further view of a prior art line driver arrangement.

From the above the skilled person will appreciate certain aspects of the present invention which will explained with reference to FIGS. 16 to 20. A conventional line drive is shown in FIG. 16 with an amplifier 2, a termination portion 10, a signal portion 17, a receive output 12 and a line 9 connected to the signal portion 17. In the conventional hybrid of FIG. 16, during transmission the currents through the two secondary windings of the matching transformer 3 are equal and opposite such that they compensate for each other in their respective windings of the receiver line transformer 14. During transmission, therefore, there is no voltage generated across the second transformer 14 and it is used only for the capture of incoming signals. The symmetry between the termination impedance 7 and the line impedance is clearly seen—if these two impedances are not matched the cancelling during transmit is not perfect. During receive the currents in the secondary windings of the first transformer 3 have equal and opposite effect on the primary winding thereof so that no net current flows to the amplifier 2.

Figure 17:
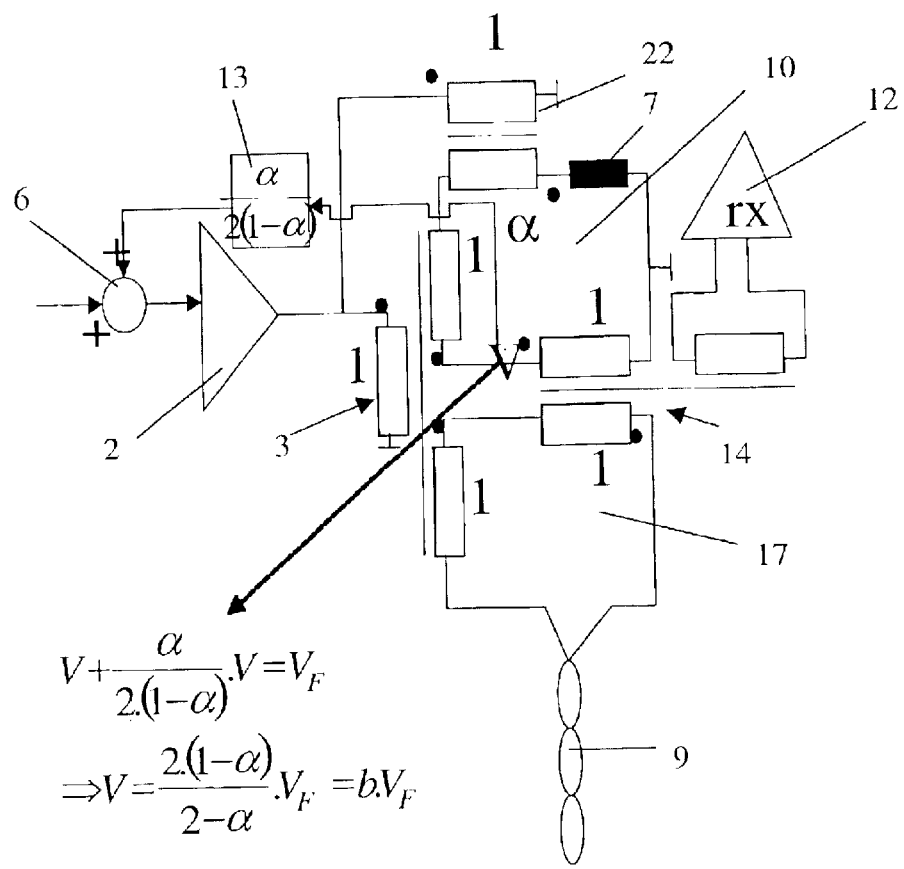
FIG. 17 shows how the embodiment of the invention disclosed with reference to FIGS. 4 to 8 is applied to the arrangement of FIG. 16.

This symmetry is broken in embodiments of the present invention as shown schematically in FIG. 17 which is a further embodiment of the present invention and is an implementation of the circuit shown in FIG. 12. It can be seen that the introduction of the (1:α) back-termination transformer 22 into the termination portion 10 reduces the power dissipating part of the termination resistance $R_{term}$ to $(1-\alpha).R_{ref}$. However, during receive the currents are not equal and opposite in the secondary windings of transformer 3. This has to be compensated by some active component. This active component is conveniently the amplifier 2 although the present invention does not exclude a second amplifier for this job. A feedback factor 13 of $\alpha/2(1-\alpha)$ is applied to ensure correct impedance matching during reception. In this embodiment the feedback 13 is supplied from the output side of the transformer 3 however as indicated above the feedback may be obtained at any position of the circuit influenced by the receive signals. In this arrangement m=1, k=1, a=0. The constant b can be calculated in the following way:

$$V + \frac{\alpha}{2 \cdot (1-\alpha)} \cdot V = V_{FE} \Rightarrow V =$$

$$\frac{2 \cdot (1-\alpha)}{2-\alpha} \cdot V_{FE} = b \cdot V_{FE} \frac{m \cdot \alpha}{(2-\alpha) \cdot b \cdot G'} = \frac{\alpha}{(2-\alpha) \cdot b \cdot G} = \frac{\alpha}{2 \cdot (1-\alpha) \cdot G}$$

from which $b=2(1-\alpha)/(2-\alpha)$. The skilled person will appreciate that this may be extended to other values of m, k, a and b.

Figure 18A:
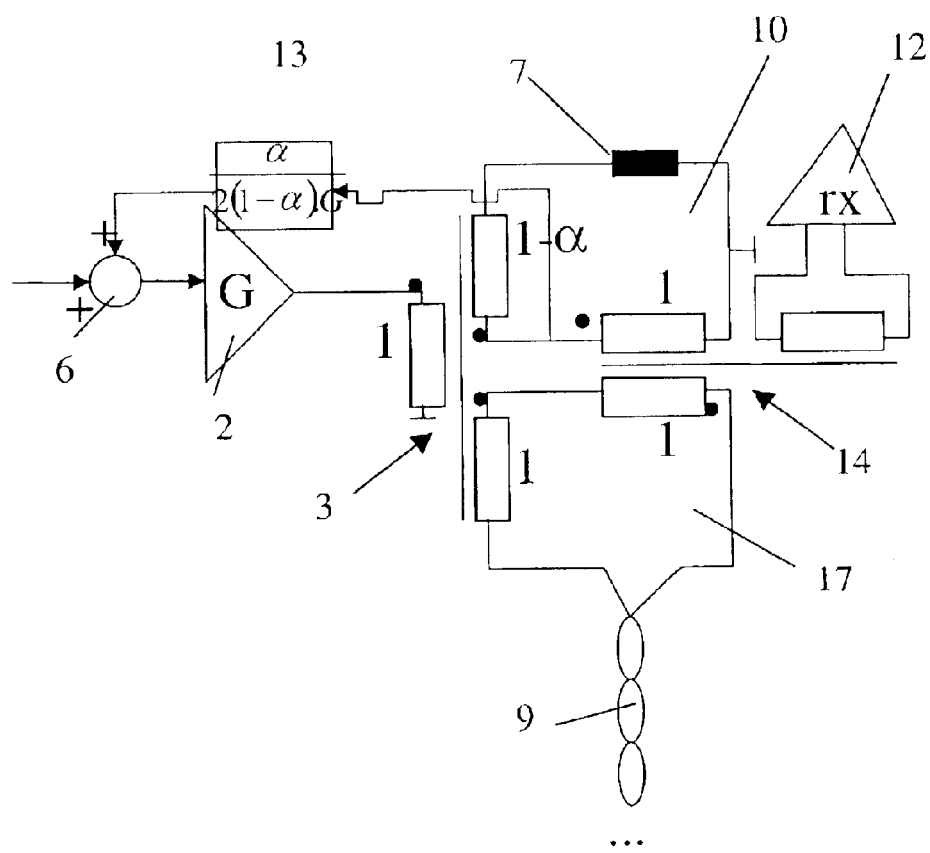
FIGS. 18a and b show how the arrangement of FIG. 17 can be simplified to reduce the component count of that embodiment.
Figure 18B:
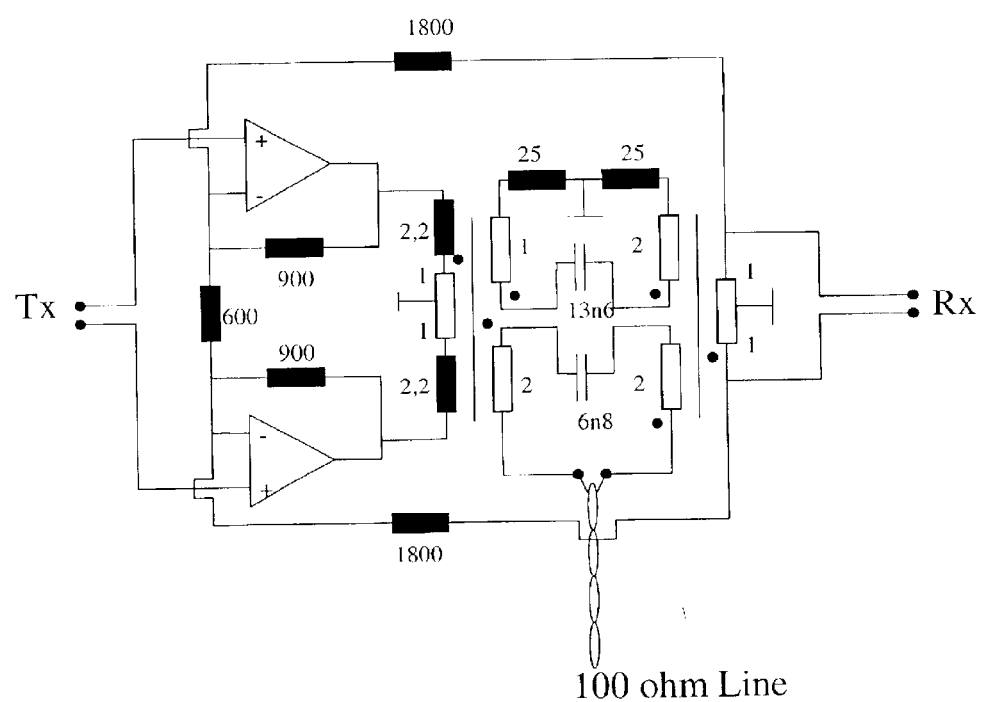

Referring now also to FIGS. 18a and b, a simpler version equivalent to the embodiment of FIG. 17 is disclosed, in which only two transformers are needed. The power dissipating impedance 7 of the termination portion 10 has the value $(1-\alpha).R_{ref}$. The turns ratio of the first transformer 3 is altered in order to incorporate the back transformer into this transformer 3. In this manner, a complete analogue front end can be implemented with only two transformers. FIG. 18b shows a circuit based on the scheme shown in FIG. 18a for feeding a 100 ohm transmission line. Some practical values for the components are shown where 2=40 μH, 1=10 μH and the values 2.2, 25, 600, 900, 1800 are in ohms, the capacitances are 13.6 nanofarads (or 13600 picofarads), 6.8 nanofarads (or 6800 pF) The coupling of the transformers can be 99.5% or better.

Figure 19:
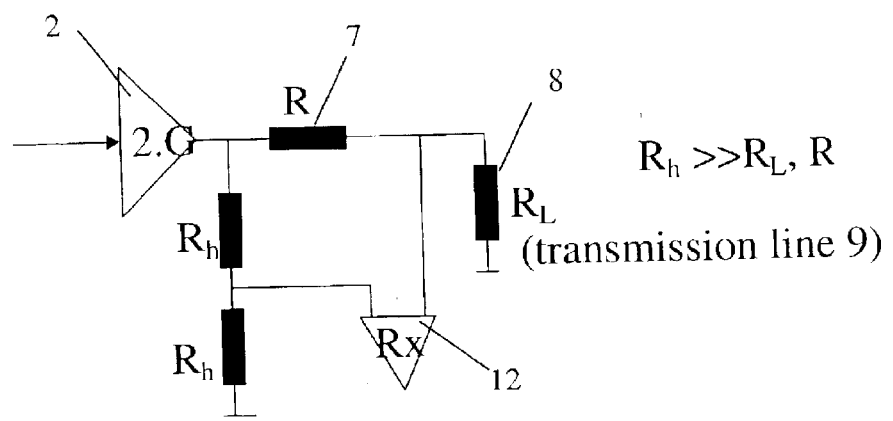
FIG. 19 shows a further view of a prior art line driver arrangement.
Figure 20:
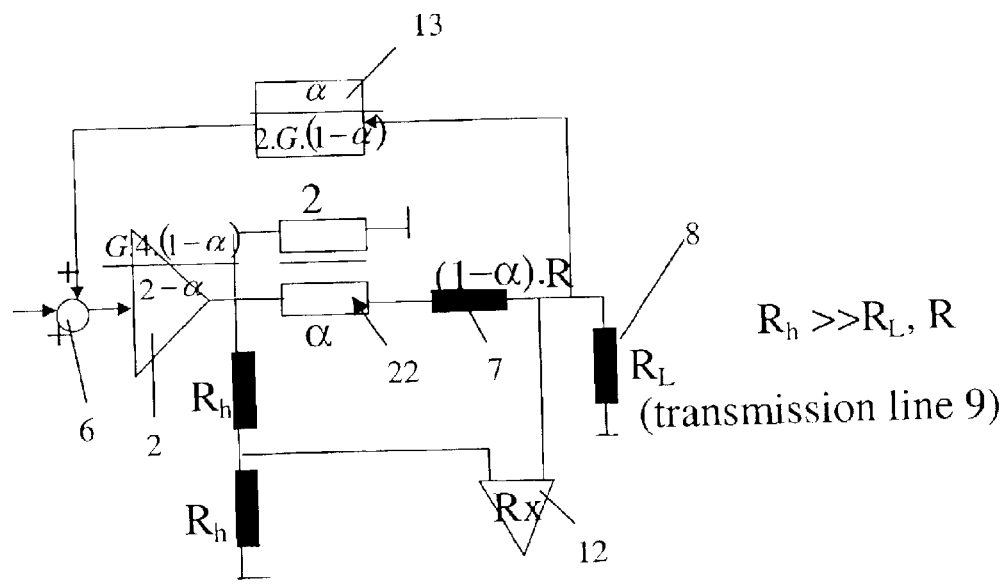
FIG. 20 shows how the embodiment of the invention disclosed with reference to FIGS. 4 to 8 is applied to the arrangement of FIG. 19.

In FIG. 19, the traditional hybrid line driver has been drawn showing a simple series termination. In this case during transmit the power is transmitted through the termination impedance 7 as the value of $R_H$ is much higher than the values of resistance 7 or 8. For the receiver output 12, the resistors $R_H$ and the impedances 7 and 8 form voltage dividers in parallel which cancel out any effect of the amplifier 2. FIG. 20 comprises a diagram of how the circuit of FIGS. 8 to 12 can be applied to this simple series termination.

The back-termination of the present invention recuperates at least part of the current which is traditionally lost to the power dissipating termination impedance and gives that recovered current back to the active element (op-amp 2). This produces a line driver with an output power of, for example, $(2-\alpha).V_{NE}^2/R$, which is lower than that of some prior art arrangements by the factor $\alpha/2$ and enables a combination of a low voltage op-amp 2 with a line transformer (1:1:N) for best performance. In addition, the line transformer (1:1:N) may be operated as a common mode choke. To provide matching during a receive operation a feedback 13 is fed back to the input of an active element, e.g. amplifier 2, from the signal portion of the circuit.

The present invention is particularly useful for implementation as part of a modem for use in broadband communications, such as for example xDSL communication. It may be found that the active back-termination of this invention is more space consuming than, for example, the resistive back termination of EP0901221 because of the bulkiness of the additional transformer (1:α). If this turns out to be the case, it might be found useful to implement the line driver/modem of this invention at the customer premises (CPE) rather than at the central office (CO) side.

What is claimed is:

1. A line driver for use with a power dissipating load, the line driver comprising:
   a hybrid circuit,
   a signal portion for connection to the load; and
   a termination portion connected to an output of the hybrid circuit for load matching, the termination portion comprises:
   a power dissipating termination impedance which is supplied in use by the hybrid circuit with a termination current,
   a back termination transformer,
   a first winding of the transformer being coupled in series with said termination impedance, and
   a second winding of the transformer being coupled in parallel with said termination impedance,
   wherein a portion of a voltage dropped across the termination portion is dropped across the first winding to thereby cause the power dissipated in said termination impedance to be less than the power available to the signal transmission portion for signal transmission to the load.

2. The line driver according to claim 1, further comprising a feedback circuit to feedback current from a portions of the signals received by the signal portion from the load to an input of the hybrid circuit for impedance matching to the load.

3. The line driver according to claim 1, wherein the load is a transmission line.

4. The line driver according to claim 1, wherein the hybrid circuit comprises an amplifier.

5. The line driver according to claim 1, wherein the value of said termination impedance ($R_{term}$) is lower than a characteristic impedance of said associated load ($R_{load}$) by a factor proportional to $(1-\alpha)$ related to the turns ratio of said back termination transformer (1:α).

6. The line driver according to claim 1, wherein a turns ratio of said back-termination transformer (1:α) is between 0 and 1.

7. The line driver according to claim 1, wherein, during a receive operation, a portion of a current derived from a far end voltage ($V_{FE}$) is fed back into said amplifier in a proportion ($\alpha/G.2.(1-\alpha)$) which is arranged to control the output of said amplifier in such a manner that correct input impedance matching from said termination point is ensured during signal reception from the load.

8. The line driver according to claim 7, wherein the receive operation feedback is supplied from a node (u) where the voltage level is substantially independent of the transmitted signal, whereby a back-termination is implemented in such a manner that gain and stability during a transmit operation are substantially unaffected by said feedback.

9. The line driver according to claim 1, wherein said termination impedance ($R_{term}$) is coupled in series with a primary winding of said back-termination transformer (1:α).

10. The line driver according to claim 9, wherein the value of said termination impedance ($R_{term}$) is determined in accordance with the equation $R_{term}=R_{load} \cdot (1-\alpha/\alpha^2)$, in which $R_{load}$ is the load impedance and α is a turns ratio of said back-termination transformer (1:α).

11. The line driver according to claim 1, wherein said termination impedance ($R_{term}$) is coupled in series with a secondary winding of said back-termination transformer (1:α).

12. The line driver according to claim 11, wherein the value of said termination impedance ($R_{term}$) is determined in accordance with the equation $R_{term}=R_{load} \cdot (1-\alpha)$, in which $R_{load}$ is the load impedance and $\alpha$ is a turns ratio of said back-termination transformer (1:$\alpha$).

13. The line driver according to claim 1, wherein said amplifier has a gain (A) in accordance with the equation $A=2(1-\alpha)/2-\alpha$, in which $\alpha$ is the turns ratio of said back-termination transformer (1:$\alpha$).

14. The line driver according to claim 1, wherein said back-termination transformer (1:$\alpha$) comprises an auto-transformer.

15. The line driver according to claim 1, wherein said back-termination transformer is included in a feedback loop which provides feedback to the input side of said amplifier, said amplifier being implemented using an operational amplifier (op-amp) which operates off a low voltage supply.

16. The line driver according to claim 1, wherein a secondary winding of said back-termination transformer (1:$\alpha$) is serially coupled with a primary winding of a line matching transformer (1:1:N) of said line driver.

17. The line driver according to claim 16, said line matching transformer comprising a splitting transformer (1:1:N), a first primary winding of which is coupled in series with said secondary winding of said back-termination transformer (1:$\alpha$) and a second primary winding of which is coupled to a load ($R_{load}$).

18. The line driver according to claim 16, wherein a secondary winding of said line matching transformer (1:1:N) is coupled to receiving circuitry.

19. The line driver according to claim 16, wherein said line matching transformer (1:1:N) is operated as a common-mode choke.

20. The line driver according to claim 1, wherein said back termination transformer (1:$\alpha$) is integrated with a transmission line transformer.

21. The line driver according to claim 1, wherein the nominal output power of said line driver is in the region of $(2-\alpha) \cdot V_{NE}^2/R_{term}$, in which: $\alpha$ is the turns ratio of said back-termination transformer (1:$\alpha$); $V_{NE}$ is the near-end voltage of said line driver; and $R_{term}$ is the value of said termination impedance.

22. A modem suitable for broadband communication, preferably an xDSL modem, including a line driver according to claim 1.

23. The line driver according to claim 1, further comprising a line transformer with a first winding in said termination portion and a second winding in said signal portion.

24. A method of operating a line driver for use with an associated power dissipating load, said line driver comprising, a hybrid circuit, a signal portion and a termination portion which includes a power dissipating termination impedance and a back-termination transformer having at least two windings, and is coupled with said termination impedance, the method including dropping across one of said at least two windings of the back transformer a portion of a voltage dropped across the termination portion to thereby cause the power dissipated in said termination resistance to be less than the power available to the signal transmission portion for signal transmission to the load.

25. The method according to claim 24, including dissipating in said termination impedance ($R_{term}$) less power than is dissipated in the associated load ($R_{load}$).

26. The method according to claim 24, including feeding back into the hybrid circuit during a receive operation an impedance synthesising current derived from a far-end voltage ($V_{FE}$) and thereby synthesising during a said receive operation a preferred load matching impedance ($Z_{ref}$) in said termination portion.

27. The method according to claim 26, including feeding back said impedance synthesising current from a node (u) whose level is independent of transmitted signals.

28. A modem suitable for broadband communication, including a line driver comprising:
- a hybrid circuit,
- a signal portion for connection to the load; and
- a termination portion having a back transformer, and connected to an output of the hybrid circuit for load matching,
- wherein the termination portion is operable to drop across one winding of at least two windings of the back transformer, a portion of a voltage dropped across the termination portion to thereby cause the power dissipated in said termination resistance to be less than the power available to the signal transmission portion for signal transmission to the load.

29. The modem according to claim 28, wherein said modem is an xDSL modem.

* * * * *